(12) United States Patent
Shimizu (10) Patent No.: US 7,648,397 B2
(45) Date of Patent: Jan. 19, 2010

(54) ELECTRONIC PART EQUIPPED UNIT

(75) Inventor: Tomohiko Shimizu, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/188,657

(22) Filed: Aug. 8, 2008

(65) Prior Publication Data

US 2009/0042444 A1 Feb. 12, 2009

(30) Foreign Application Priority Data

Aug. 10, 2007 (JP) ............... 2007-208837

(51) Int. Cl.
*H01R 13/66* (2006.01)
(52) U.S. Cl. ................ 439/620.21
(58) Field of Classification Search .......... 439/658, 439/76.2, 620.26, 949, 417, 620.21, 404, 439/925, 620.01, 620.09, 620.1; 333/181–184, 333/16

See application file for complete search history.

(56) References Cited

U.S. PATENT DOCUMENTS 7,297,029 B2 * 11/2007 Ueno et al. ............ 439/620.21
7,470,151 B2 * 12/2008 Yamaguchi et al. ......... 439/658
2006/0073738 A1 * 4/2006 Nagaoka et al. ............ 439/721

FOREIGN PATENT DOCUMENTS

JP 2006-109587 A 4/2006

* cited by examiner

*Primary Examiner*—Edwin A. Leon
(74) *Attorney, Agent, or Firm*—Sughrue Mion, PLLC (57) ABSTRACT

An electronic part equipped unit includes a case body that includes a first recess portion for containing an electronic part and a second recess portion for containing a relay terminal which is connected to the electronic part, a wire side terminal to which a middle portion of a wire is attached, and a cover member to which the wire side terminal is attached. A wire positioning rib is formed on the cover member and is brought into contact with the wire to position the wire. A wire position correcting rib for correcting a position of the wire is formed in the second recess portion. The wire position correcting rib which is inserted into an inner portion of the cover member corrects the position of the wire when the cover member to which the wire side terminal is attached is fitted to the second recess portion of the case body.

4 Claims, 8 Drawing Sheets

FIG. 8

ELECTRONIC PART EQUIPPED UNIT

BACKGROUND

The present invention relates to an electronic part equipped unit including an electronic part at inside of a case body and attached to a middle portion of a wire.

For example, in various sensors mounted to an automobile or the like, noise from a noise source having a high frequency component, such as a horn or a wire, and external noise from a neon sign or the like, an induction noise or the like are conducted to the sensors through a wire, and there is a concern of bringing about an erroneous operation thereby. In order to remove the noise, development of an electronic part equipped unit (noise prevention piece) has been promoted.

Figure 8:
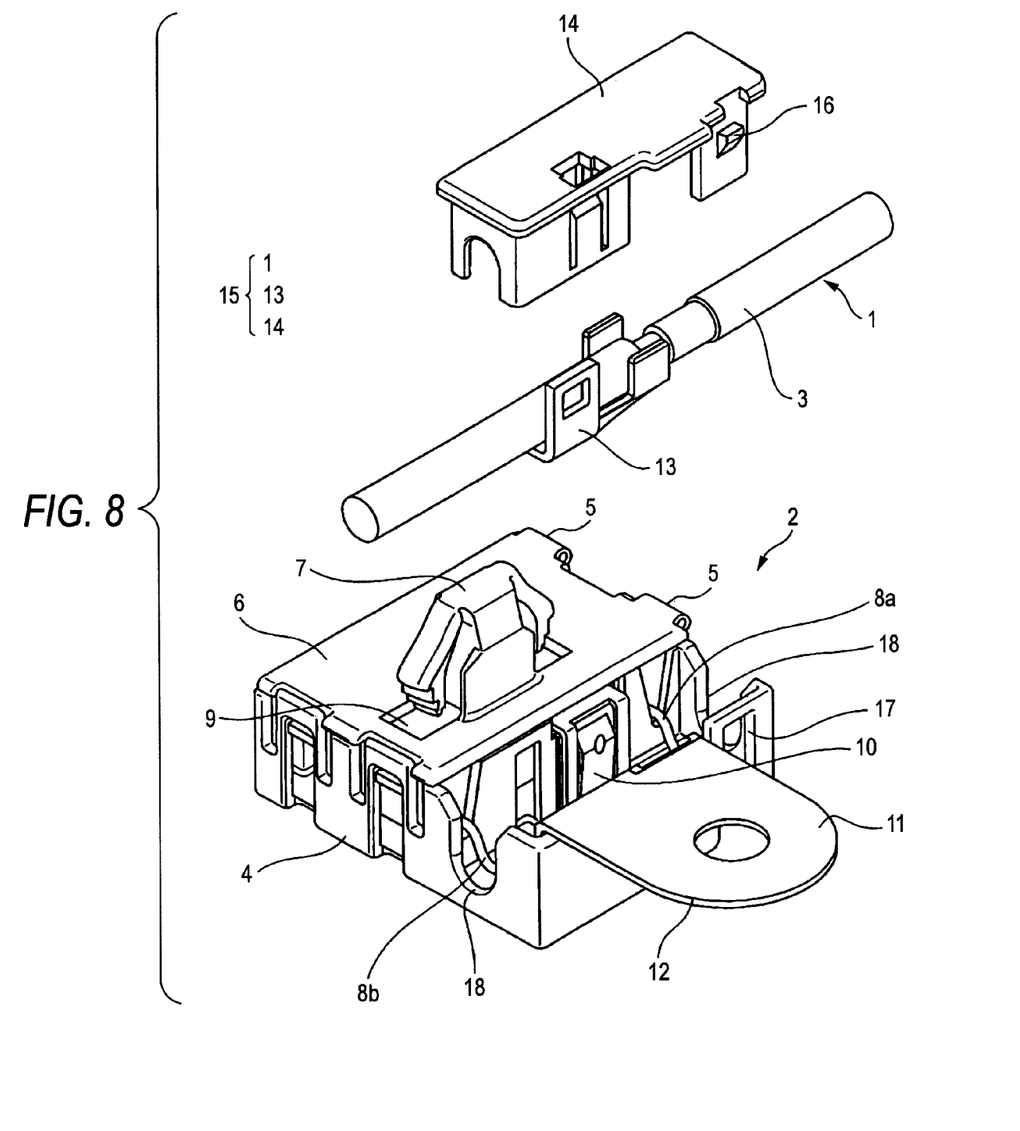
FIG. 8 is a disassembled perspective view of an electronic part equipped unit of a background art.

In FIG. 8, a reference number 1 designates a wire. Further, a reference number 2 designates an electronic part equipped unit connected to a middle portion 3 of the wire 1. The electronic part equipped unit 2 includes a case body 4 having an electronic part containing recess portion and a fitting connection recess portion, a containing recess portion cover 6 consecutively aligned to the case body 4 by way of a hinge 5 for covering the electronic part containing recess portion, a resin locking portion 7 formed at the containing recess portion cover 6 and locked to an attaching counter party, an electronic part 9 which is contained in the electronic part containing recess portion and in which a pair of leads 8a and 8b are extended to the fitting connection recess portion, a relay terminal 10 brought into contact with the lead 8a on one side, a ground terminal 12 made of a metal which is brought into contact with the lead 8b on other side and in which a portion projected from the fitting connection recess portion is formed as a ground portion 11, and a cover attached wire 15 which includes a wire side terminal 13 and a cover member 14 and attached to the middle portion of the wire 1 and in which the wire side terminal 13 is brought into contact with the relay terminal 10 and the cover member 14 is fitted to the fitting connection recess portion.

In the electronic part equipped unit 2, the fitting connection recess portion and the cover member 14 fitted thereto are disposed between the resin locking portion 7 and the ground portion 11. The cover member 14 and the fitting connection recess portion are fitted to each other with a cover side fitting portion 16 and a projected locking portion 17.

When the electronic part equipped unit 2 is attached to a vehicle, first, the resin locking portion 7 is inserted to a seat face made of a metal of an attaching counter party to be provisionally fixed, next, the ground portion 11 of the ground terminal 12 is fastened by a screw to connect to thereby finish fixing a total thereof.

Further, as a technology with regard to the electronic part equipped unit 2, for example, a disclosed technology of Patent Reference 1 is described below.

[Patent Reference 1] JP-A-2006-109587

Meanwhile, according to the electronic part equipped unit 2, in a case that the wire 1 is positionally shifted at an inner portion of the cover member 14, when the cover attached wire 15 is fitted to the fitting connection recess portion, there is a possibility that the positionally shifted wire 1 is brought into contact with the relay terminal 10 attached to the fitting connection recess portion to pose a problem that a wire defect is brought about depending on cases.

SUMMARY

The invention has been carried out in view of the above-described situation and it is a problem thereof to provide an electronic part equipped unit capable of preventing a wire defect.

In order to achieve the above object, according to the present invention, there is provided an electronic part equipped unit, comprising:

a case body that includes a first recess portion for containing an electronic part and a second recess portion for containing a relay terminal which is connected to the electronic part;

a wire side terminal to which a middle portion of a wire is attached; and a cover member to which the wire side terminal is attached, wherein a wire positioning rib is formed on the cover member and is brought into contact with the wire to position the wire;

wherein a wire position correcting rib for correcting a position of the wire is formed in the second recess portion; and wherein the wire position correcting rib which is inserted into an inner portion of the cover member corrects the position of the wire when the cover member to which the wire side terminal is attached is fitted to the second recess portion of the case body.

According to the above configuration, the position of the wire is not shifted but stabilized at the inner portion of the cover member. In a state before fitting the cover attached wire to the second recess portion, the wire is disposed at a predetermined position by the wire positioning rib. Further, according to the invention, even when the wire position is assumedly shifted at the inner portion of the cover member in the procedure of fitting the cover attached wire to the second recess portion, or, the shift is brought about in the fitting procedure, the shift is corrected by the wire position correcting rib. Therefore, the wire is not brought into contact with a relay terminal.

Preferably, the wire position correcting rib is an end portion of a protecting wall arranged at a side of the relay terminal at a portion of connecting the relay terminal and the wire side terminal. The wire position correcting rib is projected to a side of the wire more than the wire positioning rib when the cover member is fitted to the second recess portion.

According to the above configuration, the wire position correcting rib has a function as the protecting wall for protecting a portion of the relay terminal. Further, the wire position correcting rib is projected to the side of the wire more than the wire positioning rib, therefore, the wire position correcting rib has a function of making the wire away from a portion of connecting the relay terminal and the wire side terminal.

According to the above configurations, an advantage of capable of preventing a wire defect is achieved. Further, an advantage of capable of providing a further excellent mode of the wire position correcting rib for preventing the wire defect is achieved.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
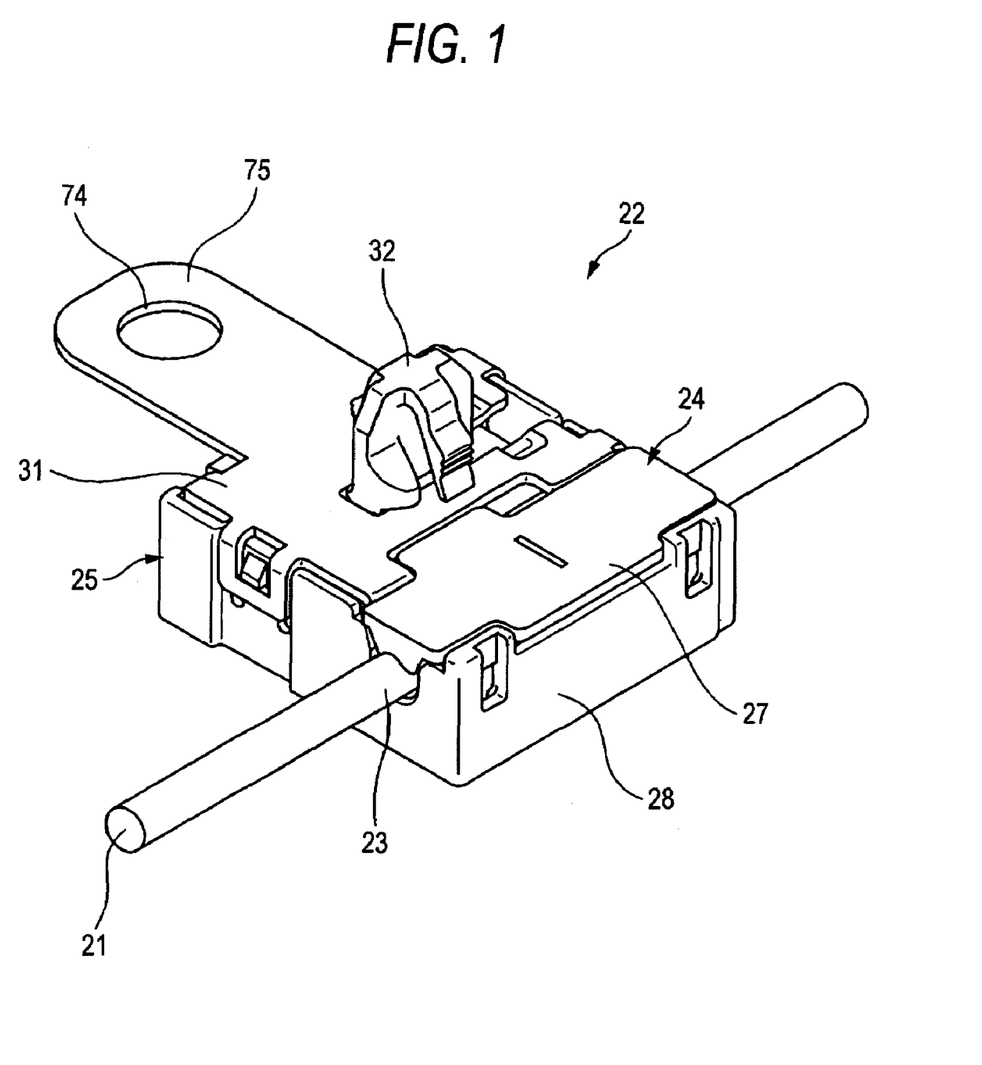
FIG. 1 is a perspective view showing an embodiment of an electronic part equipped unit of the invention.
Figure 3:
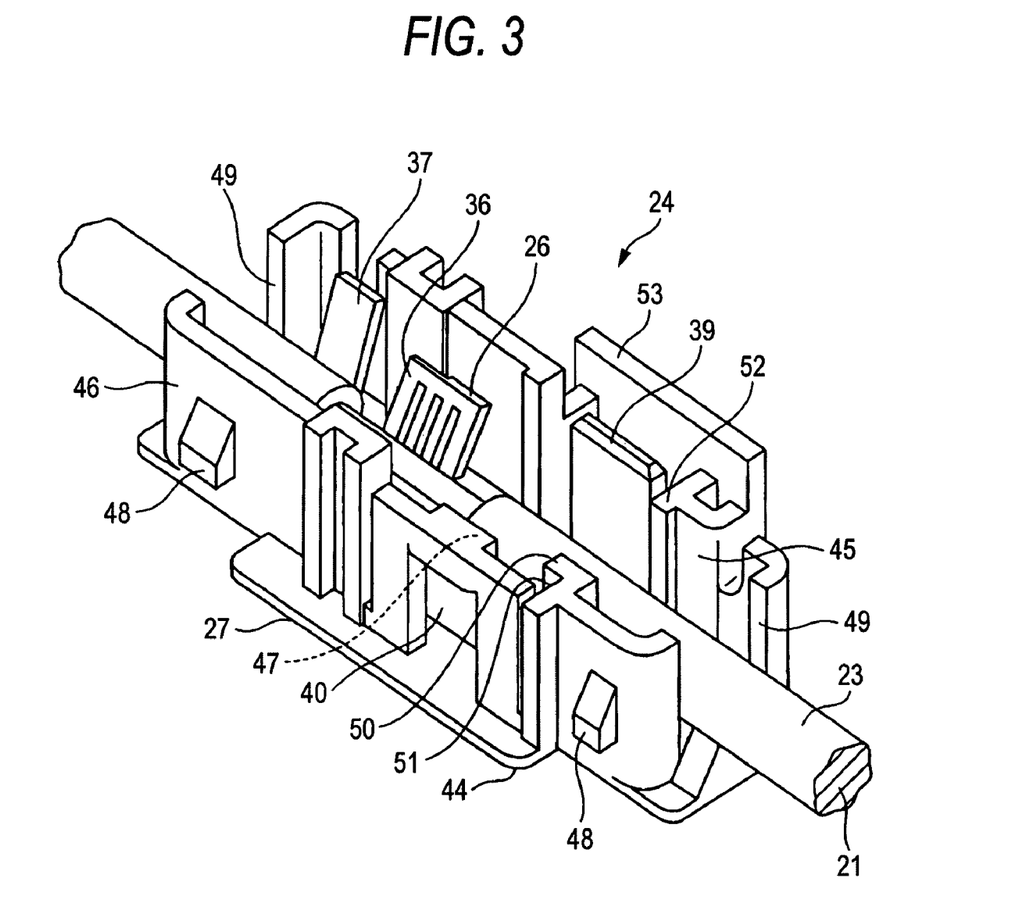
FIG. 3 is a perspective view of a cover attached wire.
Figure 4:
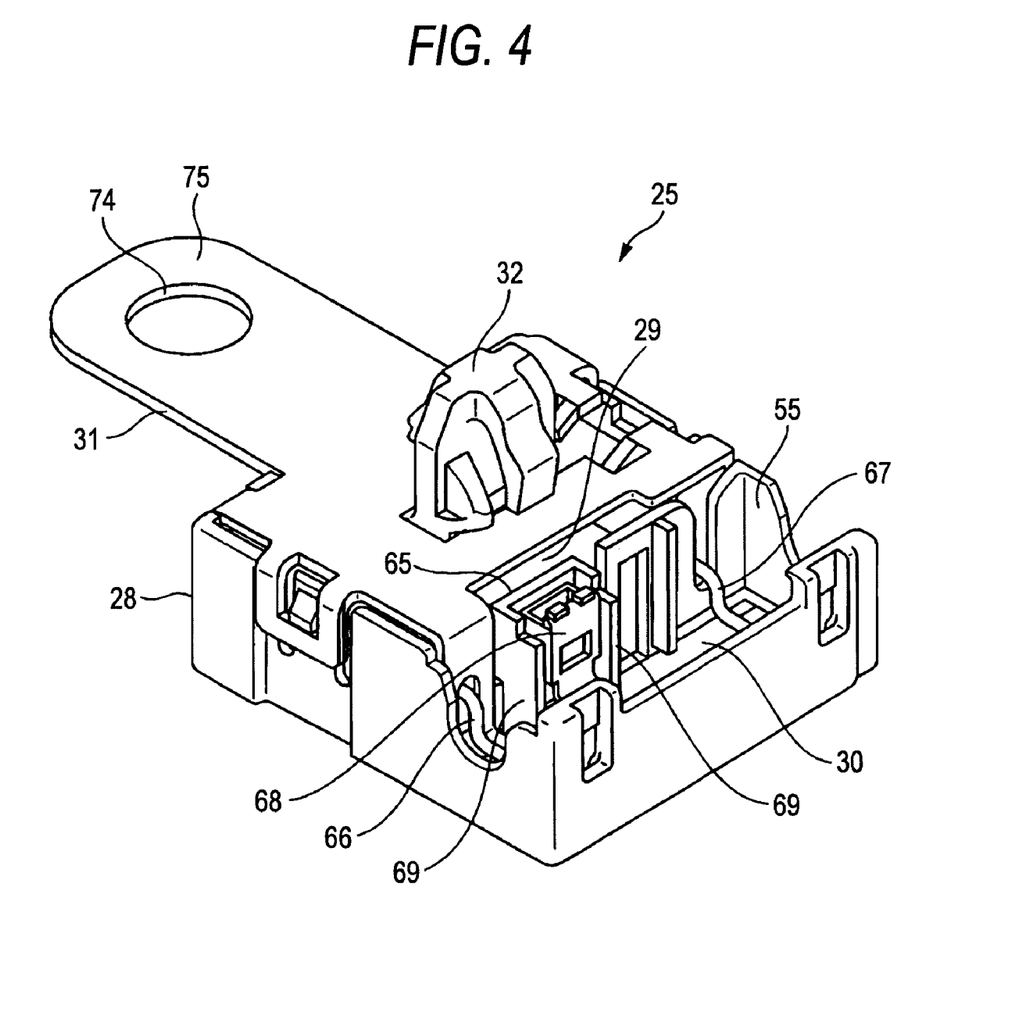
FIG. 4 is a perspective view of a unit main body.
Figure 5:
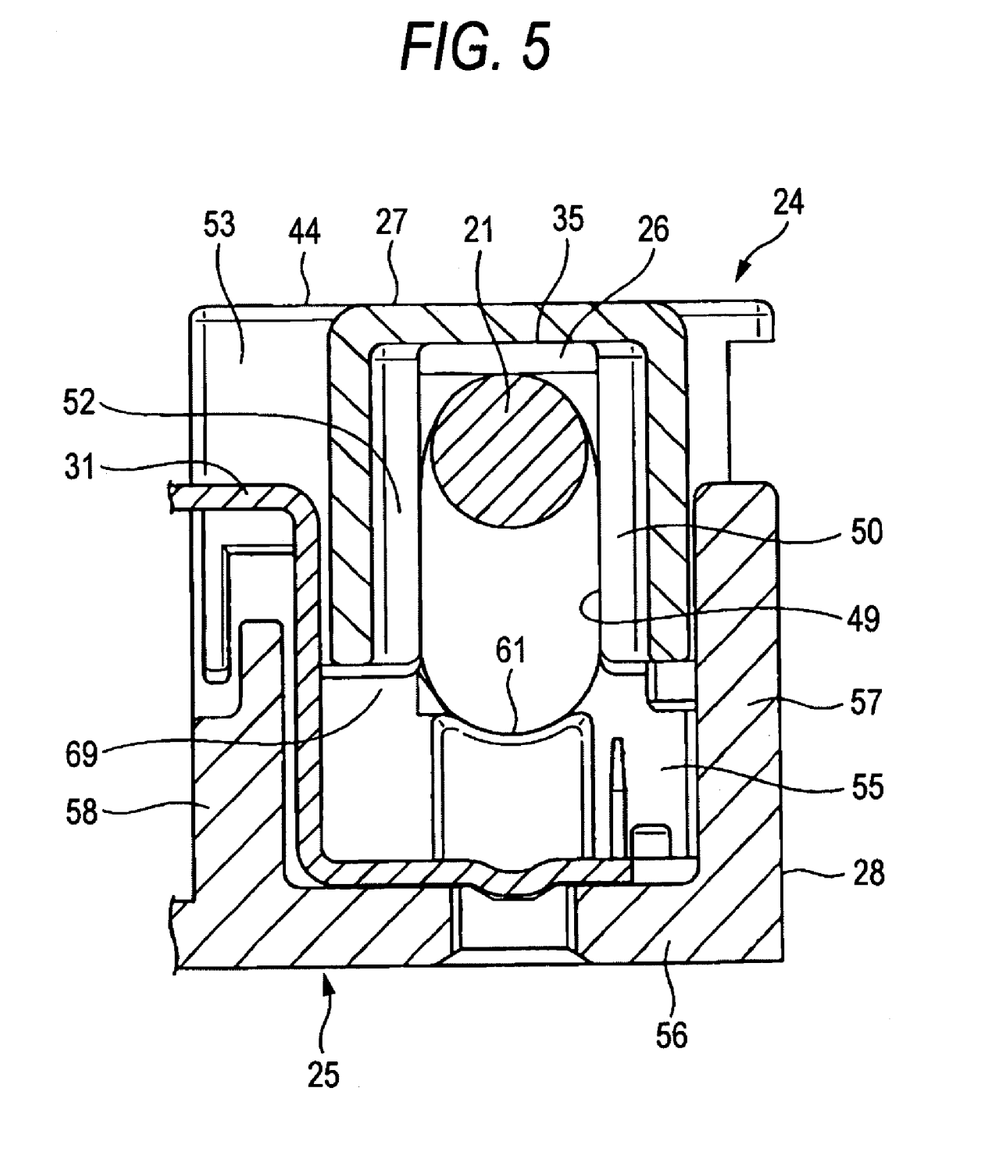
FIG. 5 is a sectional view showing a wire positioning rib and a wire position correcting rib in a procedure of fitting the cover attached wire to a fitting connection recess portion.
Figure 6:
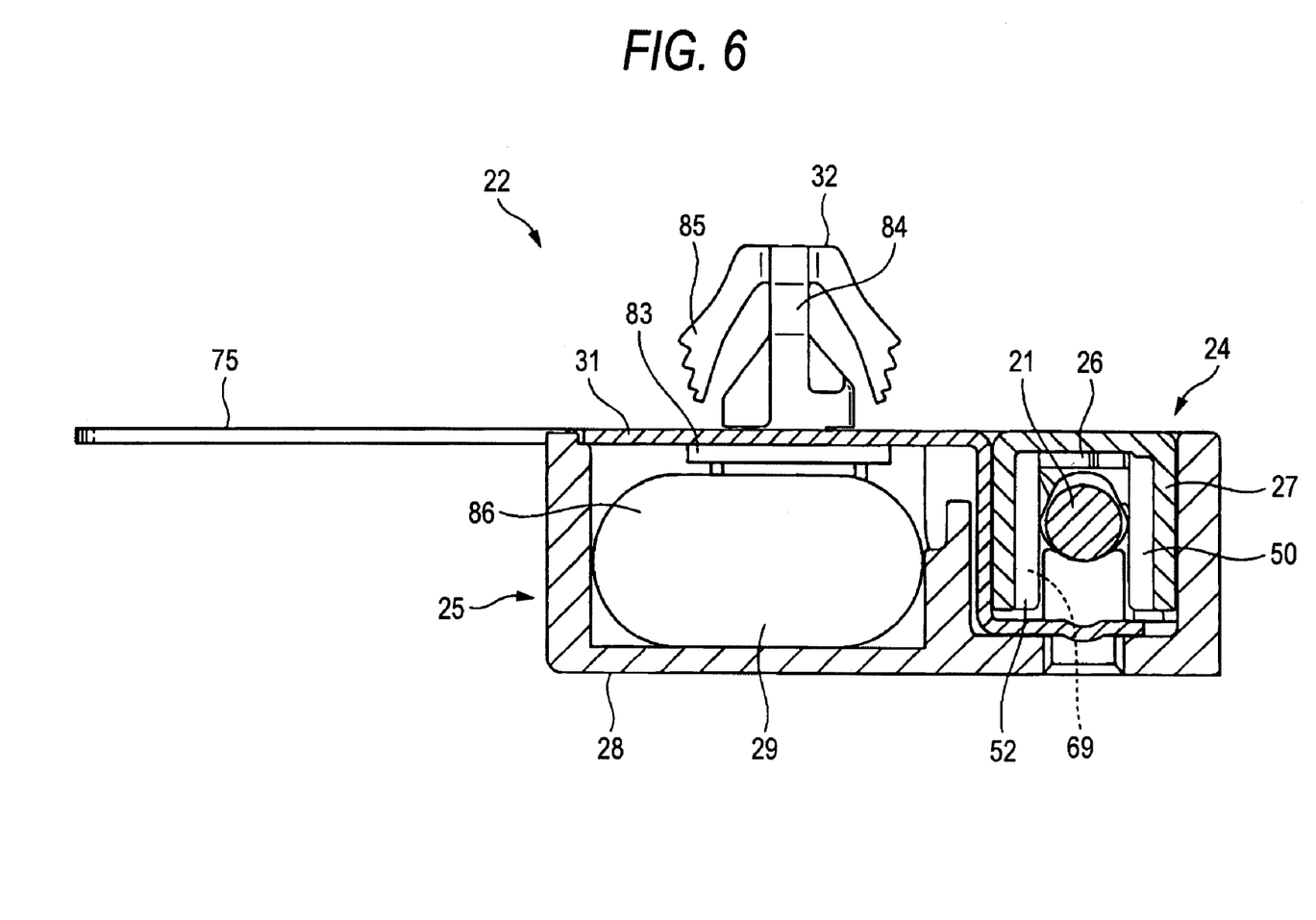
FIG. 6 is a vertical sectional view of the unit main body in a state of fitting the cover attached wire to the fitting connection recess portion.
Figure 7:
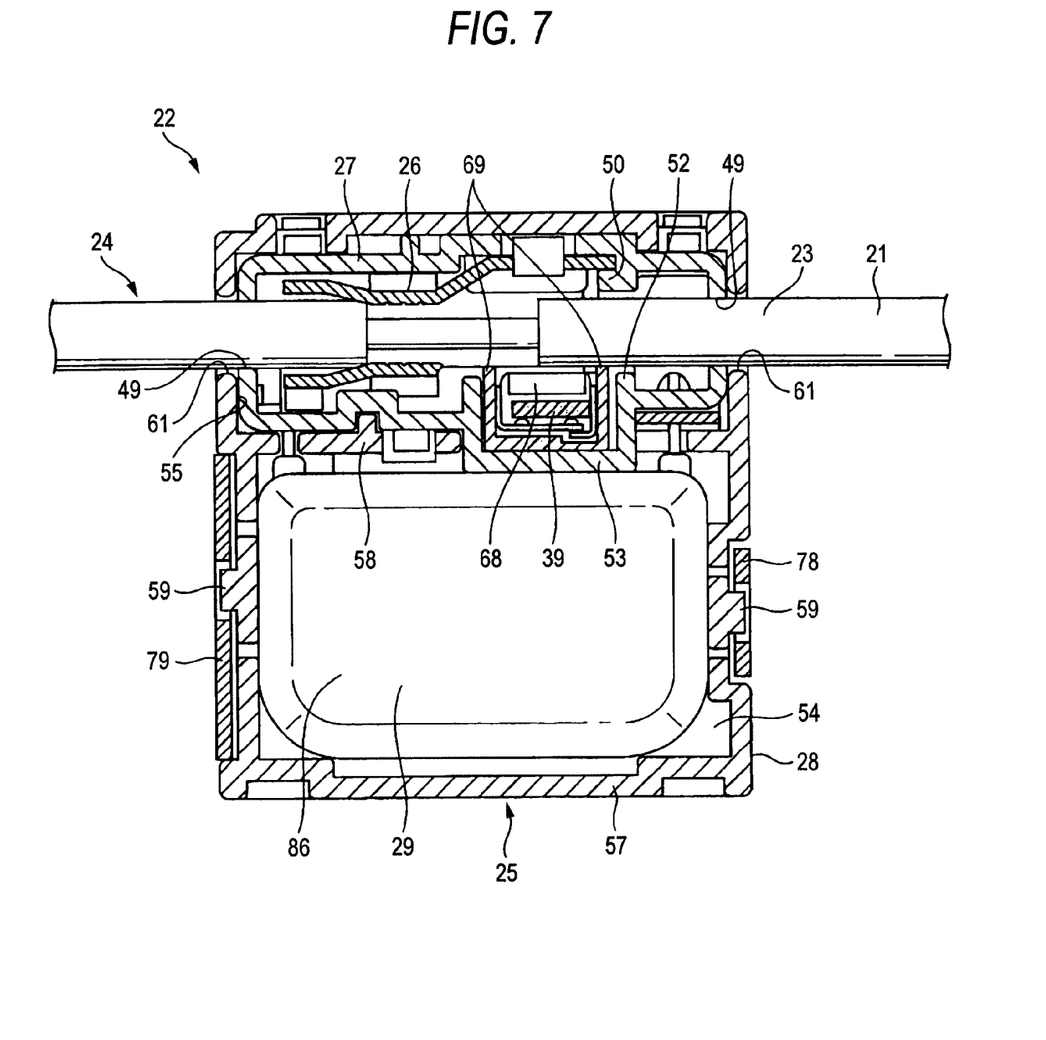
FIG. 7 is a cross-sectional view of the unit main body in the state of fitting the cover attached wire to the fitting connection recess portion.

An explanation will be given in reference to the drawings as follows. FIG. 1 is a perspective view showing an embodiment of an electronic part equipped unit of the invention. Further, FIG. 2 is a disassembled perspective view showing a constitution of the electronic part equipped unit, FIG. 3 is a perspective view of a cover attached wire, FIG. 4 is a perspective view of a unit main body, FIG. 5 is a sectional view showing a wire positioning rib and a wire position correcting rib in a procedure of fitting the cover attached wire to a fitting connection recess portion, FIG. 6 is a vertical sectional view of the unit main body in a state of fitting the cover attached wire to the fitting connection recess portion, and FIG. 7 is a cross-sectional view of the unit main body in the state of fitting the cover attached wire to the fitting connection recess portion.

Figure 2:
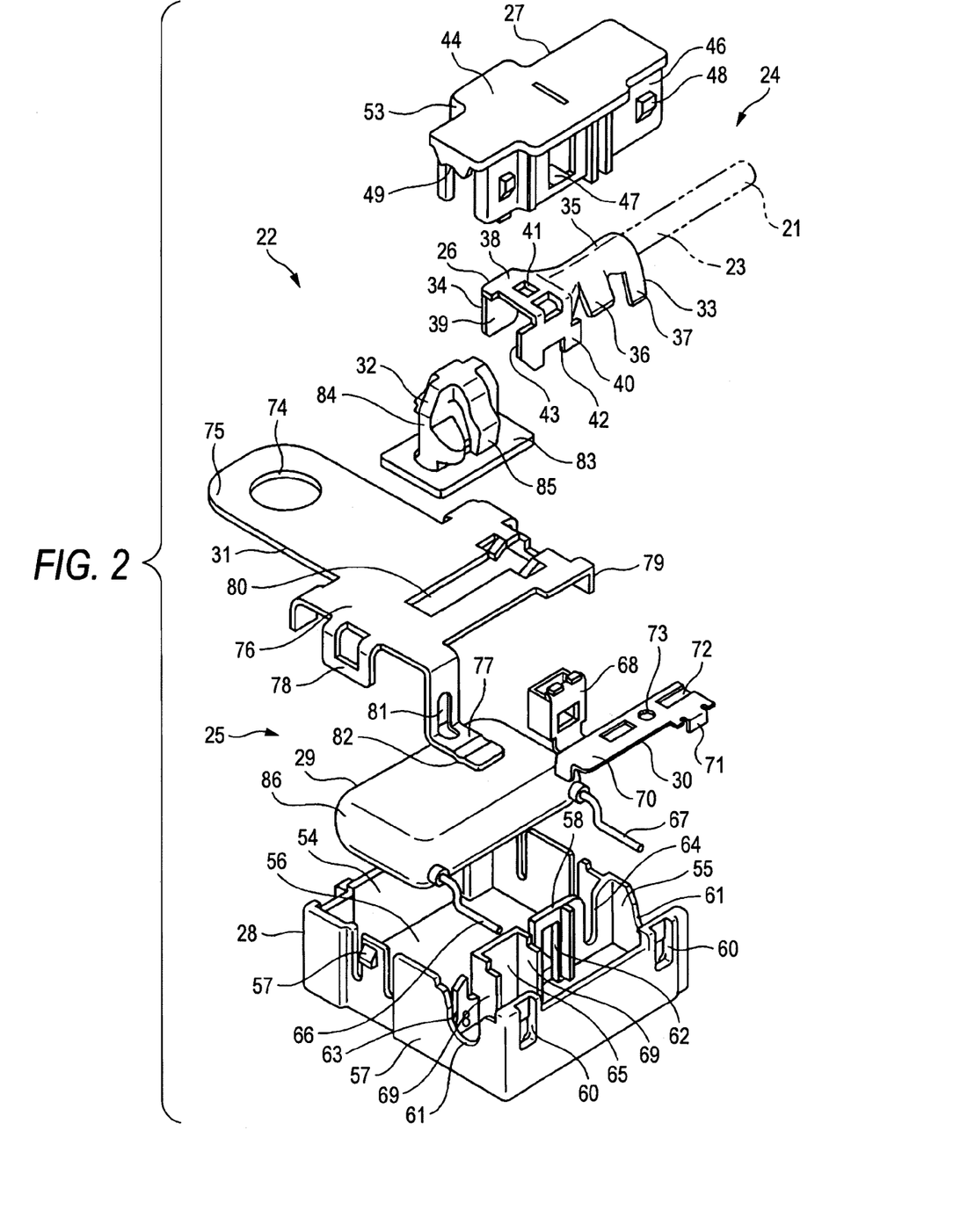
FIG. 2 is a disassembled perspective view showing a constitution of the electronic part equipped unit.

In FIG. 1 and FIG. 2, a reference number 21 designates a wire. Further, a reference number 22 designates an electronic part equipped unit connected to a middle portion 23 of the wire 21. The electronic part equipped unit 22 includes a cover attached wire 24 which is attached to the middle portion 23 of the wire 21, and a unit main body 25 electrically connected by fitting the cover attached wire 24.

The cover attached wire 24 includes a wire side terminal 26 and a cover member 27. Further, the unit main body 25 fitted with the cover attached wire 24 includes a case body 28, an electronic part 29, a relay terminal 30, a ground terminal 31, and a clamp 32. The respective constitutions will be explained in reference to FIG. 1 through FIG. 7 as follows (after explanation of the constitutions, integration thereof will be explained).

In the explanation of the embodiment, although not particularly limited, the wire 21 is wired to a vehicle of an automobile or the like (made to be applicable to other than a vehicle). Further, the electronic part equipped unit 22 is locked by and fixed to a predetermined seat face of a vehicle body.

In FIG. 1 and FIG. 2, the wire 21 is one piece of a plurality of wires constituting a wire harness, or a single wire and is constituted by including a conductor and an insulating cover portion for covering the conductor. The wire side terminal 26 is electrically connected to the middle portion 23 of the wire 21.

In FIG. 2 and FIG. 3, the wire side terminal 26 includes a metal having a conductivity and includes a wire connection portion 33 directly connected to the conductor, and an electric contact portion 34 consecutively aligned to a front side of the wire connection portion 33. A reference number 35 designates a bottom portion (bottom) of the wire side terminal 26. The wire connection portion 33 includes a pair of conductor fastening pieces 36 for fastening the conductor exposed by removing a sheath of the middle portion 23 of the wire 21, and a pair of cover fastening portions 37 for fastening the cover portion.

The electric contact portion 34 includes a base portion 38, a connection tab 39 (terminal contact portion) consecutively aligned to one side portion of the base portion 38, and a locking portion 40 consecutively aligned to other side portion of the base portion 38. The electric contact portion 34 is formed by folding. The base portion 38 and the connection tab 39 and the locking portion 40 are formed in a channel-like shape by folding. The wire 21 is passed through between the connection tab 39 and the locking portion 40. The base portion 38 is formed with a through hole 41 for positioning to the cover member 27. The through hole 41 is formed at a center of the base portion 38.

A front end of the locking portion 40 is formed with a recess portion 42 for locking. The recess portion 42 is formed as a portion for preventing the wire side terminal 26 from being drawn from the cover member 27. A front side of the locking portion 40 is formed with a positioning wall 43. The positioning wall 43 is formed frontward from the recess portion 42. The connection tab 39 has U shape and is formed as a portion of carrying out an electric connection by being inserted to the relay terminal 30 of the unit main body 25.

The wire side terminal 26 is inserted to an inner portion of the cover member 27 from a side of the bottom portion 35 in a state of being connected to the middle portion 23 of the wire 21. Further, the wire side terminal 26 is prevented from being detached from the cover member 27 when locked by the cover member 27.

In FIG. 2 through FIG. 3, the cover member 27 is a member made of an insulating synthetic resin, locks the wire side terminal 2. The cover member 27 is formed so as to be fitted to the case body 28 of the unit main body 25. The cover member 27 includes a ceiling wall 44 and a side wall continuous to the ceiling wall 44. With regard to the side wall, an inner side of the side wall is formed to constitute a wire containing portion 45. Further, with regard to the side wall, an outer side (side wall per se) is formed to constitute a case body insertion guide portion 46 functioning as a guide when inserted to the case body 28.

Also, the side wall is formed with a locking projection 47. Further, the side wall is formed with a plurality of cover side fitting portions 48 substantially in a projected shape. The cover side locking portion 48 is formed to be fitted to the case body 28. The locking projection 47 is formed as a portion of locking the wire side terminal 26 inserted to the inner portion of the cover member 27. A side wall portion having the locking projection 47 is formed to constitute an arm substantially in a channel-like shape as shown by FIG. 3. The arm substantially in the channel-shape is formed to be provided with a flexibility and is bent to an outer side in a procedure of locking the wire side terminal 26 by the locking projection 47 and is recovered to an original position after locking.

Further, in a terminal semiinserting state in which the wire side terminal 26 is not locked and insertion to the cover member 27 is finished at a middle portion of procedure, the arm is brought into a state of being bent to the outer side, and therefore, even when the cover member 27 is intended to be fitted to the case body 28, a front end of the arm is brought into contact with the case body 28 (end portion of a side wall 57 constituting an opening edge portion of a fitting connection recess portion 55 mentioned later) and the fitting cannot be carried out (the arm and the case body 28 are provided with a function as a portion of detecting the terminal semiinserting state).

In a regular state in which the wire side terminal 26 is completely locked (the arm is recovered to the original position), when the cover member 27 is fitted to the case body 28, the bending of the arm to the outer side is hampered by the case body 28. A state of locking the wire side terminal 26 is excellently maintained even after fitting the cover member 27 to the case body 28.

Further, the arm having the U shape is regarded as only an example. That is, one piece of a cantilever shape arm (for example, an arm (notation of which is omitted) of the cover member 14 of FIG. 8 or the like) may naturally be formed. The arm is not particularly limited so far as the arm is constituted by a shape of being bent to the outer side when the wire side terminal 26 is not locked and the insertion is brought into a middle state of the procedure.

Further, the side wall is formed with a pair of wire support portions 49 in a U-like shape for supporting the wire 21 in a press-fit state (although it is preferable that the wire 21 is supported in the press-fit state, other structure will do so far as a horizontal state of the wire 21 can be maintained. It is preferable to contribute to prevention of bending, skewed insertion or the like of the wire 21).

In FIG. 2, FIG. 3, and FIG. 7, a first wire positioning rib 50, a wall insertion groove 51, and a second wire positioning rib 52 are formed in the cover member 27. The first wire positioning rib 50 and the wall insertion groove 51 are consecutively aligned to an inner face of the side wall on a side on which the locking projection 47 is present (the side wall on the side on which the locking projection 47 is present is defined as one side wall).

The first wire positioning rib 50 and the wall insertion groove 51 are formed at a vicinity of the locking projection 47. The first wire positioning rib 50 is formed to extend straight from an inner face of the ceiling wall 44 to an opening portion of the cover member 27. The wall insertion groove 51 is formed between the first wire positioning rib 50 and one side wall. The first wire positioning rib 50 is formed by a shape in an L-like shape in a plane view thereof (when the opening portion of the cover member 27 is viewed by a plane view, the first wire positioning rib 50 is viewed in the L-like shape). The first wire positioning rib 50 is formed to be able to position the wire 21 when the first wire positioning rib 50 is brought into contact with the wire 21.

The wall insertion groove 51 is formed as a portion of preventing rattling of the wire side terminal 26. The wall insertion groove 51 is inserted with the positioning wall 43 of the wire side terminal 26. The wall insertion groove 51 is brought in mesh with the wire side terminal 26 when a force constituting rattling is assumedly exerted.

The second wire positioning rib 52 is consecutively aligned to an inner face of other side wall constituting a side opposed to the one side wall. The other side wall is formed with a protruding portion 53 in correspondence with the connection tab 39 of the wire side terminal 26. The second wire positioning rib 52 is formed at a vicinity of the protruding portion 53. Further, the second wire positioning rib 52 is formed at a position of being opposed to the first wire positioning rib 50. The second wire positioning rib 52 is formed to be extended straight to the opening portion of the cover member 27 from the inner face of the ceiling wall 44.

The second wire positioning rib 52 is formed to be able to position the wire 21 when the wire 21 is brought into contact therewith similar to the first wire positioning rib 50. Further, the second wire positioning rib 52 is formed such that a front end of the wire side terminal 26 is made to be able to be brought into contact therewith when the wire side terminal 26 is inserted to the inner portion of the cover member 27. The second wire positioning rib 52 is formed to function also as a portion of preventing rattling of the wire side terminal 26.

In FIG. 1, FIG. 2, and FIG. 4 through FIG. 7, the case body 28 of the unit main body 25 is a member made of an insulating synthetic resin and includes an electronic part containing recess portion 54 and the fitting connection recess portion 55. The electronic part containing recess portion 54 and the fitting connection recess portion 55 are formed by being surrounded by a bottom wall 56, the side wall 57 formed at an edge portion of the bottom wall 56, and a partition wall 58. The electronic part containing recess portion 54 is formed as a portion in a recess shape for containing the electronic part 29. The fitting connection recess portion 55 is formed as a portion in a recess shape fitted with the cover attached wire 24 to carry out electric connection. The electronic part containing recess portion 54 and the fitting connection recess portion 55 are partitioned by the partition wall 58.

A locking projection 59 and a projection locking portion 60 are formed on the side wall 57. Further, a pair of wire support portions 61 are formed on the side wall 57. The pair of wire support portions 61 are formed to be notched in a U-like shape at portions of the fitting connection recess portion 55. The pair of wire support portions 61 are formed to be able to support the wire 21 by being inserted with the wire 21 when the cover attached wire 24 is fitted thereto.

A projection locking portion 62, lead support portions 63 and 64 and a protruding portion 65 are formed on the partition wall 58. The lead support portions 63, 64 are formed for supporting the leads 66, 67 extended to the fitting connection recess portion 55 of the electronic part 29 contained in the electronic part containing recess portion 54. The lead support portions 63, 64 are formed in a slit-like shape.

The protruding portion 65 is formed by a shape of capable of containing a tab connection portion 68, mentioned later, of the relay terminal 30 on an inner side thereof (refer to FIG. 4). Further, the protruding portion 65 is formed by a shape of covering an outer side thereof by the protruding portion 53 of the cover member 27 when the cover attached wire 24 is fitted to the fitting connection recess portion 55. The protruding portion 65 is provided with a function as a protecting wall for the tab connection portion 68, mentioned later.

The protruding portion 65 is made to be able to correct a position of the wire 21 in a procedure of fitting the cover attached wire 24 to the fitting connection recess portion 55. The protruding portion 65 including a pair of wire position correcting ribs 69 has U shape in a plane view thereof. The pair of wire position correcting ribs 69 are formed at the positions of end portions of the protruding portion 65 (in other words, formed as end portions of the protecting wall). The pair of wire position correcting ribs 69 are provided with a function for preventing the wire 21 from being brought into contact with the tab connection portion 68 of the relay terminal 30 (details of which will be described later). The pair of wire position correcting ribs 69 are formed to extend straight from a bottom (bottom wall 56) of the fitting connection recess portion 55 to an opening.

The bottom (bottom wall 56) of the fitting connection recess portion 55 is formed with a fixing portion in a pin-like shape for positioning and fixing the relay terminal 30 (not illustrated).

In FIG. 2, the relay terminal 30 includes a metal having a conductivity and includes a fixed base plate portion 70 in a shape of a bus bar, and the tab connection portion 68 consecutively aligned to one side portion of the fixed base plate portion 70 and inserted with the connection tab 39 of the wire side terminal 26. The fixed base plate portion 70 is formed to be mounted and fixed to the bottom (bottom wall 56) of the fitting connection recess portion 55.

The fixed base plate portion 70 is formed with a plurality of fixing claws 71 for preventing the relay terminal 30 from being detached by being caught by the bottom of the fitting connection recess portion 55. Further, the fixed base plate portion 70 is formed with a welding portion 72 in a projected shape welded in integration by being brought into contact with the lead 67 of the electronic part 29. Cited notation 73 designates a through hole for positioning by being inserted to the fixing portion of the fitting connection recess portion 55.

The tab connection portion 68 is formed in a box-like shape. An inner portion of the tab connection portion 68 is formed with an elastic contact piece (not illustrated) of being elastically brought into contact with the connection tab 39 of the wire side terminal 26.

In FIG. 1, FIG. 2 and FIG. 4, the ground terminal 31 comprises a metal having a conductivity and includes a ground portion 75 having a through hole 74 for screw fastening, a base portion 76 continuous to the ground portion 75 and formed by a shape as a cover covering an opening portion of the electronic part containing recess portion 54, and a connection leg portion 77 continuous to the base portion 76.

The base portion 76 is provided with the function of the cover as described above, and formed with fitting portions 78, 79 to be caught by the locking projection 59 of the case body 28 by folding. Further, the base portion 76 is formed with a clamp attaching and detaching portion 80 for attaching the clamp 32 inserted to the seat face of the vehicle body to be locked thereby. The base portion 76 is formed by a shape of capable of pressing the electronic part 29 after having been contained in the electronic part containing recess portion 54.

The fitting portions 78, 79 are constituted substantially by a frame-like shape and is formed to hang down from side portions of the base portion 79 respectively. The fitting portion 78, 79 are provided with a necessary sufficient flexibility for riding over the locking projections 59 of the case body 28. The clamp attaching and detaching portion 80 is formed in a slit-like shape of notching the base portion 76. The clamp attaching and detaching portion 80 is formed to be able to slide to fix the clamp 32 after inserting the clamp 32. A portion of the clamp attaching and detaching portion 80 for inserting the clamp 32 is consecutively aligned to the fitting portion 79.

The connection leg portion 77 is a portion inserted to the fitting connection recess portion 55 and is formed by folding to bend a strip piece in an L-like shape. The portion of the connection leg portion 77 folded to bend in the L-like shape is formed with a slit 81 for escaping the lead 66 of the electronic part 29. Further, a portion in correspondence with the bottom of the fitting connection recess portion 55 is formed with a welding portion 82 in a projected shape brought into contact with the lead 68 to be welded thereto.

In FIG. 1, FIG. 2, FIG. 4, and FIG. 6, the clamp 32 is a member made of a synthetic resin, constituted by a structure attachable and detachable to and from the ground terminal 31 and constituted by a structure of being inserted to the seat face of the vehicle body to be locked by the portion. The clamp 32 is provided with a function as a locking portion. The clamp 32 includes a base plate 83 in parallel with the base portion 76 of the ground terminal 31, a stay 84 provided at a surface of the base plate 83, a pair of locking blades 85 having a flexibility and consecutively aligned to the stay 84. The clamp 32 is constituted such that the pair of locking blades 84 are inserted to the clamp holes formed at the seating face of the vehicle body and respective end portions of the locking blades 85 are caught by opening edges of the clamp holes.

In FIG. 2 and FIG. 7, the electronic part 29 includes a main body 86 and a pair of the leads 66, 67. Although as the electronic part 29, a known capacitor is used for a noise filter according to the embodiment, a diode or a resistor may be used in accordance with other use.

Next, based on the above-described constitution, integration of the cover attached wire 24, integration of the unit main body 25, integration of the electronic part equipped unit 22 and attachment of the electronic part equipped unit 22 will be explained.

With regard to the cover attached wire 24, first, an operation of exposing the conductor by removing the cover portion of the wire 21 in a predetermined range at the middle portion 23 of the wire 21 constituting a desired position and connecting the wire side terminal 26 to the exposed conductor is carried out. Next, an operation of inserting the wire side terminal 26 to an inner portion of the cover member 27 from a side of the bottom portion 35 to lock the wire side terminal 26 is carried out. At this occasion, the wire 21 is contained to the inner portion of the cover member 27 without being shifted positionally by the pair of U-like shape wire supporting portions 49, the first wire positioning rib 50, and the second wire positioning rib 52. When the wire side terminal 26 is locked by the cover member 27, the integration with regard to the cover attached wire 24 is finished.

The wire side terminal 26 is contained in the wire containing portion 47 of the cover member 27 and is protected by the cover member 27. The wire 21 is supported by the wire support portion 51 of the cover member 27. Further, the wire 21 is contained in the inner portion of the cover member 27 in a state of not being shifted positionally by the first wire positioning rib 50 and the second wire positioning rib 52. The cover attached wire 24 is finished to be integrated in the shape of maintaining the horizontal state of the wire 21.

With regard to the unit main body 25, first, an operation of containing the main body 86 of the electronic part 29 to the electronic part containing recess portion 54 of the case body 28 and mounting to position the respective front end sides of the leads 66, 67 to the bottom of the fitting connection recess portion 55 while inserting middle portions of the leads 66, 67 of the electronic part 29 to the lead support portions 63, 64 is carried out. Next, the relay terminal 30 and the connection leg portion 77 of the ground terminal 31 are respectively attached to predetermined positions of the fitting connection recess portion 55. At this occasion, the base portion 76 of the ground terminal 31 is fitted to the case body 28 while covering the electronic part containing recess portion 54 containing the main body 86 of the electronic part 29. Successively, an operation of respectively welding the relay terminal 30 and the connection leg portion 79 and fixing the respective welding portions 82, 72 in the projected shape and the leads 66, 67 is carried out. Thereby, an integrating operation with regard to the unit main body 25 is finished.

After finishing to integrate the cover attached wire 24 and integrate the unit main body 25, an operation of fitting the cover attached wire 24 to the fitting connection recess portion 55 of the unit main body 25 and forming an electric connection state simultaneously therewith is carried out. Thereby, an operation of integrating the electronic part equipped unit 22 is finished. Further, although in a procedure of fitting the cover attached wire 24 to the fitting connection recess portion 55, a position of the wire 21 is assumedly shifted in the inner portion of the cover member 25, or, in the procedure of fitting, a shift is brought about, the shift is corrected by the wire position correcting rib 69 formed at the fitting connection recess portion 55. Specifically, when the cover attached wire 24 is fitted to the fitting connection recess portion 55, the side of the wire position correcting rib 69 is projected to the side of the wire 21 more than the second wire positioning rib 52 (the wire position correcting rib 69 is formed by such a shape), thereby, the wire 21 is corrected (refer to FIG. 7). The wire 21 is made to be remote from the tab connection portion 68 by the wire position correcting rib 69. Therefore, the wire 21 is not brought into contact with the relay terminal 30 (tab connection portion 68).

As explained above in reference to FIG. 1 through FIG. 7, according to the invention, the wire 21 is positioned, further, the wire position is also corrected, and therefore, an advantage of capable of preventing a wire defect is achieved.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2007-208837 filed on Aug. 10, 2007, the contents of which are incorporated herein for reference.

What is claimed is:

1. An electronic part equipped unit, comprising:
    a case body that includes a first recess portion for containing an electronic part and a second recess portion for containing a relay terminal which is connected to the electronic part;
    a wire side terminal to which a middle portion of a wire is attached; and
    a cover member to which the wire side terminal is attached,
    wherein a wire positioning rib is formed on the cover member and is brought into contact with the wire to position the wire, the wire positioning rib having an L-shape in plan view of the cover member;
    wherein a wire position correcting rib for correcting a position of the wire is formed in the second recess portion; and
    wherein the wire position correcting rib which is inserted into an inner portion of the cover member corrects the position of the wire when the cover member to which the wire side terminal is attached is fitted to the second recess portion of the case body.

2. The electronic part equipped unit according to claim 1, wherein the wire positioning rib includes a pair of abutment rib portions which are brought into contact with the wire from a direction perpendicular to an axis direction of the wire; and
    wherein contact area of the pair of abutment rib portions with respect to the wire are different to each other.

3. The electronic part equipped unit according to claim 1, wherein the wire position correcting rib is an end portion of a protecting wall arranged at a side of the relay terminal at a portion of connecting the relay terminal and the wire side terminal; and
    wherein the wire position correcting rib is projected to a side of the wire more than the wire positioning rib when the cover member is fitted to the second recess portion.

4. The electronic part equipped unit according to claim 3, wherein the wire position correcting rib has a notch formed in an upper projected portion thereof.

* * * * *